(12) United States Patent
Patel et al.

(10) Patent No.: US 11,290,095 B1
(45) Date of Patent: Mar. 29, 2022

(54) PROGRAMMABLE DYNAMIC CLOCK STRETCH FOR AT-SPEED DEBUGGING OF INTEGRATED CIRCUITS

(71) Applicant: Xilinx, Inc., San Jose, CA (US)

(72) Inventors: Niravkumar Patel, San Jose, CA (US); Amitava Majumdar, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 17/330,042

(22) Filed: May 25, 2021

(51) Int. Cl.
| | |
|---|---|
| *G06F 1/00* | (2006.01) |
| *H03K 5/156* | (2006.01) |
| *H03K 19/173* | (2006.01) |
| *H03K 5/05* | (2006.01) |
| *H03K 5/24* | (2006.01) |
| *G06F 1/08* | (2006.01) |

(52) U.S. Cl.
CPC ............. *H03K 5/156* (2013.01); *G06F 1/08* (2013.01); *H03K 5/05* (2013.01); *H03K 5/249* (2013.01); *H03K 19/1737* (2013.01)

(58) Field of Classification Search
None
See application file for complete search history.

(56) References Cited

U.S. PATENT DOCUMENTS

| | | |
|---|---|---|
| 5,673,273 A | 9/1997 | Almy |
| 6,389,558 B1 | 5/2002 | Herrmann |
| 6,944,836 B1 | 9/2005 | Lai |
| 7,739,564 B1 | 6/2010 | Lai |
| 8,063,654 B2 | 11/2011 | Rahman et al. |
| 8,072,234 B2 | 12/2011 | Fox |
| 8,327,201 B1 | 12/2012 | Lai |
| 9,685,957 B2 | 6/2017 | How |
| 10,705,561 B1 * | 7/2020 | Rangarajan ............. G06F 1/324 |
| 10,816,598 B1 | 10/2020 | Merugu et al. |
| 11,042,180 B1 * | 6/2021 | Lowe ....................... G06F 1/08 |
| 2001/0030565 A1 * | 10/2001 | Ebuchi .................. H03L 7/0996 327/258 |
| 2002/0078412 A1 | 6/2002 | Wang et al. |
| 2005/0154552 A1 | 7/2005 | Stroud et al. |
| 2012/0126846 A1 | 5/2012 | Jong et al. |
| 2014/0097877 A1 * | 4/2014 | Baeckler .................. G06F 1/12 327/149 |
| 2017/0038789 A1 * | 2/2017 | Pal ............................ G06F 1/08 |
| 2021/0091756 A1 * | 3/2021 | Iwata ....................... G06F 1/08 |

\* cited by examiner

*Primary Examiner* — Tuan T Lam
(74) *Attorney, Agent, or Firm* — Kevin T. Cuenot

(57) ABSTRACT

An integrated circuit can include one or more clock controllers. Each clock controller corresponds to a different clock signal of a set of one or more clock signals of the integrated circuit. Each clock controller is configured to implement a clock stretch mode that generates a modified clock signal having a frequency that is less than the clock signal. The integrated circuit can include a trigger circuit configured to enable selected ones of the one or more clock controllers to implement the clock stretch mode. The trigger circuit and the one or more clock controllers are hardwired and are programmable using control infrastructure circuitry of the integrated circuit.

20 Claims, 10 Drawing Sheets

US 11,290,095 B1

PROGRAMMABLE DYNAMIC CLOCK STRETCH FOR AT-SPEED DEBUGGING OF INTEGRATED CIRCUITS

TECHNICAL FIELD

This disclosure relates to integrated circuits (ICs) and, more particularly, to speed-path debugging of manufactured ICs.

BACKGROUND

Integrated circuit (IC) development involves extensive testing and debugging of a circuit design intended to be implemented within an IC prior to manufacturing that design in silicon. Once a circuit design is implemented as a manufactured IC, various additional types of testing and/or debugging may be performed on the physical device. Testing and/or debugging on a manufactured IC may include functional testing of the manufactured IC, process debugging of the manufactured IC intended to detect issues in the manufacturing process, and speed-path debugging of the manufactured IC intended to detect setup and/or hold issues.

SUMMARY

An integrated circuit can include one or more clock controllers. Each clock controller can correspond to a different clock signal of a set of one or more clock signals of the integrated circuit. Each clock controller can be configured to implement a clock stretch mode that generates a modified clock signal having a frequency that is less than the clock signal. The integrated circuit can include a trigger circuit configured to enable selected ones of the one or more clock controllers to implement the clock stretch mode. The trigger circuit and the one or more clock controllers are hardwired and are programmable using control infrastructure circuitry of the integrated circuit.

A method can include providing, within an integrated circuit, one or more clock controllers. Each clock controller can correspond to a different clock signal of a set of one or more clock signals of the integrated circuit. Each clock controller can be configured to implement a clock stretch mode that generates a modified clock signal having a frequency that is less than the clock signal. The method can include providing, within the integrated circuit, a trigger circuit configured to enable selected ones of the one or more clock controllers to implement the clock stretch mode. The method also can include dynamically programming the trigger circuit and the one or more clock controllers using control infrastructure circuitry of the integrated circuit during operation of the integrated circuit, wherein the trigger circuit and the one or more clock controllers are hardwired.

This Summary section is provided merely to introduce certain concepts and not to identify any key or essential features of the claimed subject matter. Other features of the inventive arrangements will be apparent from the accompanying drawings and from the following detailed description.

BRIEF DESCRIPTION OF THE DRAWINGS

The inventive arrangements are illustrated by way of example in the accompanying drawings. The drawings, however, should not be construed to be limiting of the inventive arrangements to only the particular implementations shown. Various aspects and advantages will become apparent upon review of the following detailed description and upon reference to the drawings.

DETAILED DESCRIPTION

Figure 1:
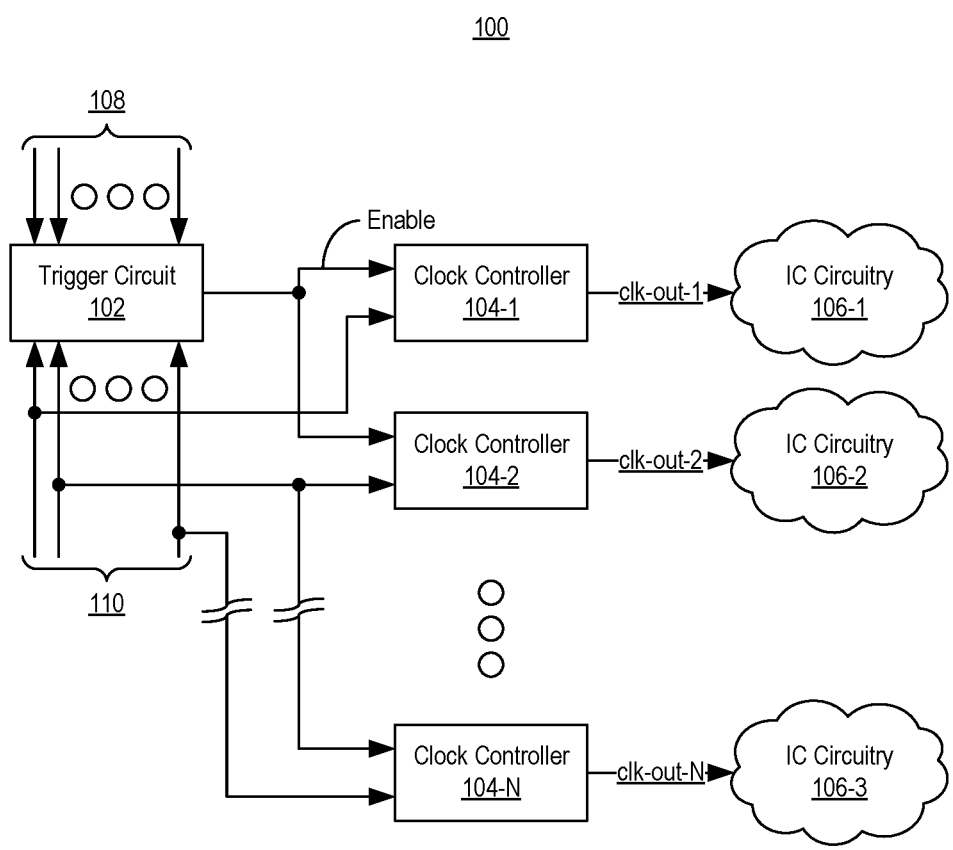
FIG. 1 illustrates an example of an integrated circuit (IC) including clock stretching circuitry.

This disclosure relates to integrated circuits (ICs) and, more particularly, to speed-path debugging of manufactured ICs. In accordance with the inventive arrangements described within this disclosure, testing and/or debugging circuitry is provided that may be included in a manufactured IC. The circuitry may be used for performing speed-path testing and/or debugging of the manufactured IC. The circuitry facilitates accelerated and efficient testing and/or debugging of speed-paths to detect and/or diagnose setup timing issues within manufactured ICs. Setup timing issues may also be referred to as "maximum frequency" timing issues. The circuitry described within this disclosure addresses discrepancies that arise between pre-silicon results and post-silicon results in speed-paths in the manufactured IC. For example, the circuitry described herein may be used in cases where the timing of a circuit design is closed using Electronic Design Automation (EDA) tools, but faults are observed within the manufactured IC when operating at speed.

Conventional testing and debugging techniques include scan dump, tweaking clocks, and laser probing. A scan dump refers to a process where a test pattern is fed into an operating manufactured IC. The IC runs for a given period of time. At an appointed time, the clocks of the IC are stopped so that data contained in the scan chains of the IC may be shifted out and compared to known good data. Scan dumps are usually taken at different times throughout the debug pattern in an attempt to isolate the particular clock cycle at which the fault occurs. Typically, the scan dump proceeds according to a binary search pattern conducted over a large range of clock cycles to pinpoint the clock cycle at which the fault occurs. Scan dumps, however, are machine-state destructive. That is, after each scan dump, the IC must be rebooted and re-initialized with the test pattern starting anew. In some cases, the IC must run for hours or days for the fault to arise. This means each iteration of the scan dump may take hours or days to complete. Scan dump may be a time intensive process particularly in cases where many iterations are needed.

Tweaking clocks refers to a process where the frequency of clocks may be changed through manipulation of the Phase Locked-Loops (PLLs) controlling the clocks in the IC.

Typically, the frequency of PLLs, however, may not be changed dynamically during operation of the IC. Instead, each change to the PLL frequency requires a reset and re-initialization for each PLL with additional time needed for the PLL to acquire lock. In addition, manipulating a clock frequency using the PLL may affect a larger cone of logic than is desired for purposes of testing and/or debugging. In another example, tweaking clocks may include adding clock dividers on the clock signal paths. This technique adds latency to the clock network within the IC and requires additional scan and physical design compliance, which is often undesirable.

Laser probing refers to a process whereby a laser is directed at portions of the manufactured IC to stress internal transistors in an effort to get the test pattern to pass or fail more often to identify the problem signal path. Laser probing is a complex testing technique that requires significant skill and experience. In many cases, laser probing results in false passes and/or the detection of new (false) speed failures. Laser probing has other disadvantages such as the need for a robust heat sink for the bare die of the IC to control temperature to prevent the IC from damage.

The inventive arrangements provide various advantages over conventional speed-path debugging techniques for ICs. The inventive arrangements are capable of operating in the manufactured IC with low resource utilization and little to no effect on the performance of the clocking networks. Inclusion of the testing and/or debugging circuitry described herein within an IC can significantly reduce the number of scan dump and/or laser probing test iterations required to determine the particular clock cycle at which a fault occurs. The testing and/or debugging circuitry described herein may be programmed dynamically during operation of the IC to stretch one or more clock cycles thereby significantly reducing the amount of test and/or debug time required. A binary search covering a range of clock cycles, for example, may be performed in significantly less time using the circuitry described herein compared to conventional speed-path debugging techniques.

FIG. 1 illustrates an example of an IC 100 including clock stretching circuitry. IC 100 may be implemented as, or represent, any of a variety of different ICs. In one aspect, IC 100 may include programmable logic. In another aspect, IC 100 may not include programmable logic. Examples of IC 100 may include, but are not limited to, a System-on-Chip (SoC), an Application Specific IC (ASIC), a programmable IC such as a Field Programmable Gate Array (FPGA), or a heterogeneous IC having a plurality of different types of subsystems.

In the example of FIG. 1, the clock stretching circuitry includes trigger circuit 102 and one or more clock controller circuits 104. The example clock stretching circuitry of IC 100 is hardwired and is programmable during operation of IC 100. That is, though the clock stretching circuitry of IC 100 is fabricated as part of IC 100 at the time of manufacture with dedicated circuit elements and interconnects, operational parameters of the clock stretching circuitry may be changed during operation of IC 100 without having to reboot, reset, or re-initialize IC 100. As defined within this disclosure, the term "dynamically," when used in reference to programming trigger circuit 102 and/or clock controllers 104, means that one or more operating parameters may be changed while IC 100 operates without requiring a reset, reboot, or initialization of IC 100.

IC 100 may include one clock controller 104 for each different clock domain in IC 100. Each of clock controllers 104-1, 104-2, through 104-N corresponds to a different one of N different clock domains of IC 100 and, as such, a different one of the clock signals 110. There may be a one-to-one relationship between the N clock domains (N clock signals 110) of IC 100 and clock controllers 104-1 through 104-N. Each clock controller 104 is capable of outputting a clock signal shown as "clk-out." During normal operation, each clock controller 104 outputs the associated clock signal 110 as the clk-out signal. Clock signal 110 is a free running and at speed clock signal. Implementation of a clock stretch mode causes selected clock controllers 104 to output a modified clock signal (e.g., a modified version of clock signal 110) as the clk-out signal. The modified clock signal generated by clock controllers 104 during implementation of the clock stretch mode (e.g., implemented for testing and/or debugging) has a frequency that is lower than the frequency of the respective clock signal 110 for a predetermined period of time. The respective clk-out signals are provided to respective portions of IC circuitry 106 corresponding to each respective clock domain. IC circuitry 106, for example, may include the circuitry clocked by the respective clk-out signals and include one or more scan chains. IC circuitry 106 may be implemented as hardwired circuitry, programmable circuitry, or a combination thereof. IC circuitry 106, for example, may represent portions of a user circuit design or user circuitry.

Trigger circuit 102 is capable of receiving a plurality of trigger signals 108 and receiving the N clock signals 110 corresponding to the N clock domains. In the example of FIG. 1, trigger circuit 102 may receive M different trigger signals 108. Both M and N may be integer values of 1 or more. The value of M may be less than, equal to, or greater than N. Trigger circuit 102 is capable of outputting an "enable" signal to each of clock controllers 104. The enable signal, which may be a single-bit signal, may be broadcast to each of clock controllers 104. Once the enable signal is asserted and broadcast to the clock controllers 104, further signals (e.g., the stretch mode CC enable signal 316 of FIG. 3) may be provided to individual ones of the clock controllers 104 to enable the clock stretch mode in selected, individual ones of the clock controllers 104 as may be desired. In this regard, clock controllers 104 may be activated or enabled to implement a clock stretch mode on an individual basis based on the enable signal that is broadcast and a stretch mode CC enable signal provided to each respective clock controller 104. It should be appreciated that a different stretch mode CC enable signal may be provided to each different clock controller 104.

While clock controllers 104 are clock domain specific, trigger circuit 102 is common to all of the clock domains of IC 100. By sharing trigger circuit 102 among the clock domains, the resource utilization and footprint of the clock stretching circuitry may be reduced.

As defined within this disclosure, the term "clock stretch mode" means an operational mode of a clock controller 104 where a modified version of clock signal 110 is generated that is synchronous with clock signal 110 corresponding to the clock controller 104. During clock stretch mode, the modified version of the clock signal (or "modified clock signal") has a reduced frequency compared to the clock signal for a predetermined number of clock cycles (e.g., window of time) of the clock signal. In one aspect, the frequency reduction may be a divide by 2 where the frequency of the modified clock signal is half that of the clock signal for the window of time. Clock stretch mode may be implemented to result in a modified clock signal with different duty cycles depending on the particular implementation of the clock controller. For example, the modified clock signal may have a duty cycle of 25% or 50%.

Figure 2:
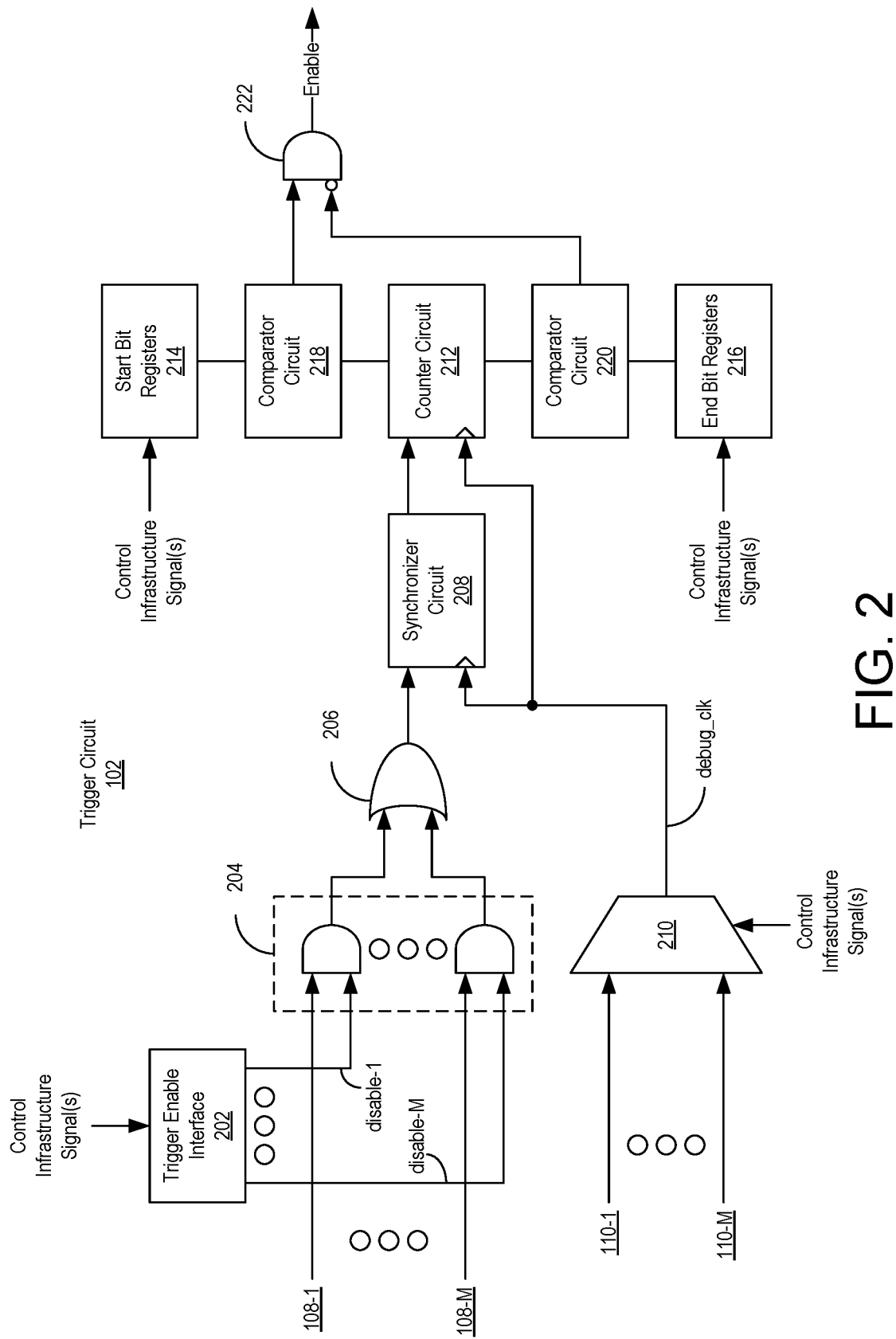
FIG. 2 illustrates an example of a trigger circuit of the clock stretching circuitry of FIG. 1.

FIG. 2 illustrates an example of a trigger circuit 102 of the clock stretching circuitry of FIG. 1. Trigger circuit 102 may include a trigger enable interface 202. Trigger enable interface 202 receives one or more control infrastructure signals that set values for disable signals disable-1 through disable-M. The disable signals may be set to a 0 value or a 1 value to disable or enable particular trigger signals 108-1 through 108-M. When a disable signal such as disable-1 takes a 0 value, for example, the corresponding AND gate 204 will output a 0 value no matter the value of trigger signal 108-1 thereby preventing the received trigger signal 108-1 from triggering or causing synchronizer circuit 208 and/or counter circuit 212 to begin operation. A 0 value for a disable signal causes the associated trigger signal 108 to be ignored for the purpose of starting operation of synchronizer circuit 208. In this manner, trigger signals 108 may be enabled or disabled on an individual basis based on the control signals received by trigger enable interface 202. It should be appreciated that trigger enable interface 202 may be dynamically programmed during operation of IC 100 to set and/or change values of the disable signals in real time or near real time in response to control infrastructure signals.

Control infrastructure signals are signals conveyed over system-level or chip-level infrastructure (e.g., circuitry) to control particular operations in IC 100. In the examples described herein, the operations are testing and/or debugging operations. The operations may be speed-path testing and/or debugging operations. The control infrastructure signals may follow an open standard or be proprietary. Within this disclosure, Internal Joint Test Action Group (IJTAG) circuitry operating in accordance with IEEE 1687 is used as an example of system-level and/or chip-level infrastructure control circuitry capable of conveying control infrastructure signals (e.g., IJTAG signals). For example, trigger enable interface 202 may be implemented as one or more registers capable of receiving and storing TDR bits that set individual ones of the disable signals. Though IJTAG is used for purposes of illustration, other types of control infrastructure circuitry and/or signals conforming to a predetermined standard, whether open or proprietary, may be used.

Each of the outputs from AND gates 204 is provided to OR gate 206 as an input. OR gate 206 performs a logical OR operation on the received input signals. OR gate 206 outputs a 1 value in response to any one of the AND gates outputting a 1 value. That is, for any trigger signal 108 that is not disabled by the corresponding disable signal and that is set to 1 in response to having detected a particular trigger condition, OR gate 206 outputs a 1 value to synchronizer circuit 208 thereby activating synchronizer circuit 208.

In the example of FIG. 2, since the trigger signals 108 are processed by AND gates 204 and OR gate 206 prior to synchronizer circuit 208, trigger signals 108 may be implemented to have a minimum pulse width when indicating a trigger event to accommodate for clock domain crossings (CDCs). An example of a CDC is where a trigger signal is detected that corresponds to a clock signal 110 other than the clock signal 110 that is passed by multiplexer 210 as the debug_clk signal. To ensure that the trigger event is detected by synchronizer circuit 208, the pulse width of the trigger signals 108, when indicating a trigger event, may be at least 1.5 times the width of the respective clock signal 110 (e.g., the clock signal 110 associated with the trigger signal 108). In another aspect, the pulse width of the trigger signals 108, when indicating a trigger event, may be at least 1.5 times the width of the slowest clock signal 110.

The example of FIG. 2 illustrates a case where each trigger signal 108 has a corresponding disable signal that is controlled by its own control bit in trigger enable interface 202. In one or more other example implementations, multiple disable signals may be controlled by a single bit in trigger enable interface 202.

Multiplexer 210 receives each of the clock signals 110. Multiplexer 210 passes one, e.g., a selected one, of clock signals 110 in response to control infrastructure signals that are used as select signals. The selected one of clock signals 110 is output as the "debug_clk" signal to the clock port of synchronizer circuit 208 and to the clock port of counter circuit 212. This ensures that, for the selected trigger signal(s), operation of the clock controllers 104 and the counting of clock cycles by counter circuit 212 is synchronized with the desired, or selected, clock signal 110.

In response to OR gate 206 outputting a 1 value, synchronizer circuit 208 begins operating and causes counter circuit 212 to begin counting clock cycles of the selected clock signal (e.g., the debug_clk signal). In the example of FIG. 2, start bit registers 214 and end bit registers 216 may be dynamically programmed by control infrastructure signals in real time or near real time to store a start value and an end value, respectively. The start value specifies the clock pulse count from counter 212 that will initiate operation of the clock stretch mode. The end value specifies the clock pulse count from counter 212 that will terminate the clock stretch mode. The window of time that the clock signal is modified corresponds to the start value and the end value.

Comparator circuit 218 compares the value specified by start bit registers 214 with the current count of counter circuit 212. In response to detecting a match, comparator circuit 218 outputs a 1 value to the non-inverting input of AND gate 222. In an example implementation, comparator circuit 218 may output the 1 value to a register (not shown) that is located between the output of comparator circuit 218 and the input of AND gate 222. The register may be "sticky" in that the register continues to store the 1 value until cleared (e.g., by control infrastructure signals) so that once AND gate 222 receives a 1 value from comparator circuit 218, AND gate 222 continues to receive a 1 value from the register until cleared.

Comparator circuit 220 compares the value specified by end bit registers 216 with the current count of counter circuit 212. In response to detecting a match, comparator circuit 220 outputs a 1 value to the inverting input of AND gate 222. In an example implementation, comparator circuit 220 may output the 1 value to a register (not shown) that is located between the output of comparator circuit 220 and the inverting input of AND gate 222. The register may be "sticky" in that the register continues to store the 1 value until cleared (e.g., by control infrastructure signals) so that once AND gate 222 receives a 1 value from comparator circuit 220, AND gate 222 continues to receive a 1 value from the register until cleared.

Initially upon operation of counter circuit 212, both comparator circuits 218, 220 output 0 values (until matches are detected) to AND gate 222. In view of the inverting input of AND gate 222, AND gate 222 receives a 0 value from comparator circuit 218 and a 1 value from comparator circuit 220 (due to inversion) causing AND gate 222 to output a 0 value as the enable signal that is broadcast to clock controllers 104.

In response to comparator circuit 218 detecting a match, comparator circuit 218 outputs a 1 value. Thus, AND gate 222 receives a 1 value from comparator circuit 218 and a 1 value from comparator circuit 220 (due to inversion) which causes AND gate 222 to output a 1 value as the enable signal that is broadcast to the clock controllers 104 to initiate the clock stretch mode. The 1 value may activate or enable the clock controllers 104. In one or more example implementations, initiation of clock stretch mode may require additional signals to become active as described in greater detail hereinbelow.

In response to comparator circuit 220 detecting a match, comparator circuit 220 outputs a 1 value. Thus, AND gate 220 receives a 1 value from comparator circuit 218 and a 0 value from comparator 220 (due to inversion) which causes AND gate 222 to output a 0 value as the enable signal that is broadcast to the clock controllers 104. The 0 value may deactivate or disable the clock controllers 104 thereby terminating the clock stretch mode.

Though not explicitly shown in FIG. 2, in example implementations, control infrastructure signals may be provided to the registers (not shown) and to counter circuit 212 to clear the respective circuit elements for re-use. As noted, trigger circuit 102 may be dynamically programmed in terms of the particular trigger signals to use, the start and end values used by comparators 218, 220, and the count maintained by counter circuit 212.

Figure 3:
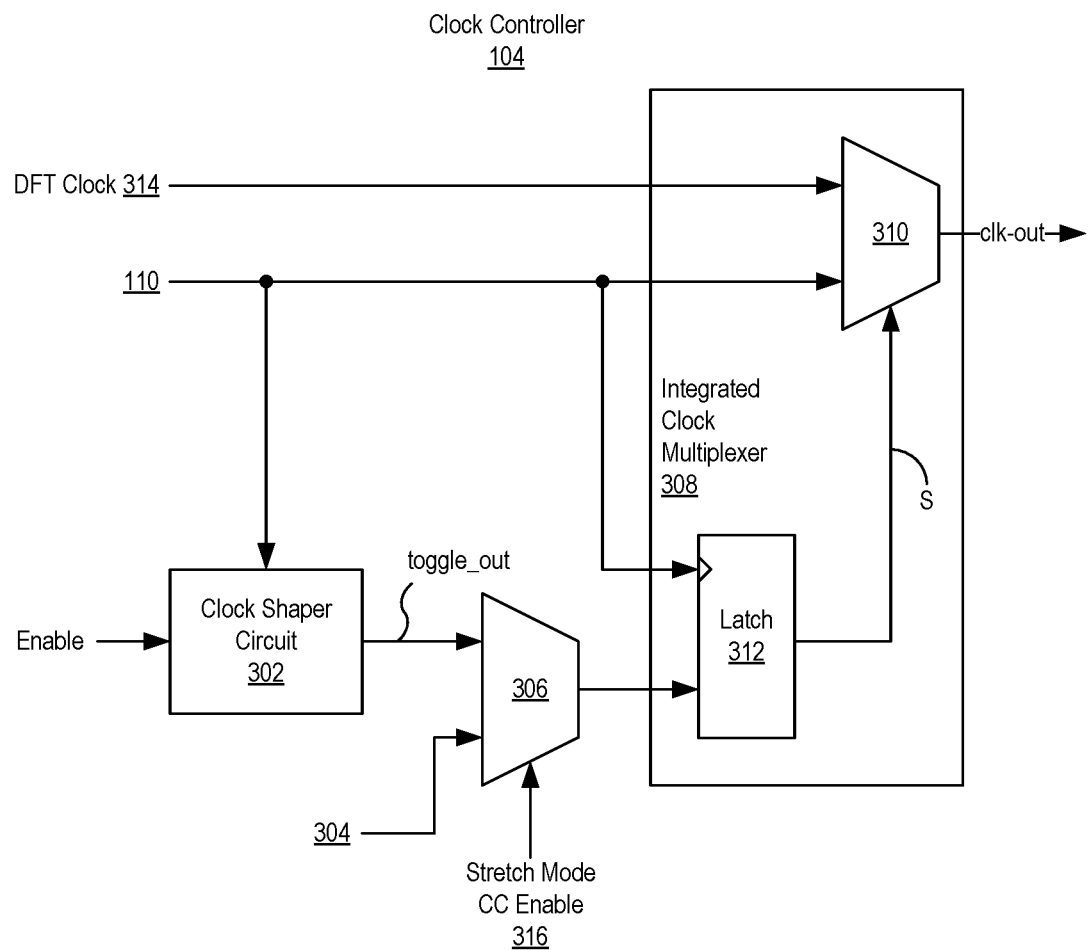
FIG. 3 illustrates an example of a clock controller circuit of the clock stretching circuitry of FIG. 1.

FIG. 3 illustrates an example of a clock controller 104 of the clock stretching circuitry of FIG. 1. In the example of FIG. 3, clock controller 104 includes a clock shaper circuit 302, a multiplexer 306, and an integrated clock multiplexer 308. Integrated clock multiplexer 308 includes a multiplexer 310 and a latch 312. In general, clock shaper circuit 302 receives the enable signal generated by trigger circuit 102.

In the example of FIG. 3, clock signal 110 is received and provided to clock shaper 302, latch 312, and to an input of multiplexer 310. Clock shaper circuit 302 receives the enable signal that is broadcast from trigger circuit 102. In response to the enable signal being set to 1, clock shaper circuit 302 begins operating to implement the clock stretch mode. Multiplexer 306 receives a stretch mode CC enable signal 316 as a select signal to pass either the signal from clock shaper circuit 302, labeled "toggle_out," or signal 304. Signal 304 may be passed during other modes of operation other than clock stretch mode (e.g., normal operation and/or other debugging modes). In one aspect, while the enable signal is broadcast to all of the clock controllers 104, stretch mode CC enable signal 316 may be clock controller specific (where the "CC" references the clock controller specificity). That is, each different clock controller 104 has a different stretch mode CC enable signal 316 thereby allowing each clock controller 104 to implement clock stretch mode independently of the others despite receiving the broadcast enable signal. In clock stretch mode, multiplexer 306 passes, or outputs, the toggle_out signal output from clock shaper circuit 302 to the input of latch 312. Stretch mode CC enable signal 316 may be generated by control logic or provided by the infrastructure control signals. In one example implementation, stretch mode CC enable signal 316 is provided as a Test Data Register (TDR) bit of IJTAG circuitry.

Further, when clock shaper circuit 302 is active, DFT clock 314 may be gated so as to be held static or unchanging (e.g., at 0). In this regard, DFT clock 314 may be output from a clock gate circuit (not shown). The operation of the clock gate circuit used on DFT clock 314 may be controlled by the enable signal broadcast to clock controllers 104 and/or stretch mode CC enable signal 316. For example, response to both the enable signal and the stretch mode CC enable signal 316 being active, e.g., set to 1, the clock gate circuit may gate DFT clock 314.

DFT clock 314 typically has a different and slower frequency than that of clock signal 110. DFT clock 314 may be any of a variety of different clock signals. For example, DFT clock 314 may be an external scan clock, an infrastructure control grid (e.g., IJTAG) clock, or another clock generated internally within IC 100. Clock signal 110 is the particular at speed and free running clock signal that is controlled by clock controller 104.

With the clock stretch mode enabled in clock controller 104, clock shaper circuit 302 provides the select signal, labeled "S," to multiplexer 310. The select signal S is generated based on clock signal 110. Further, since clock signal 110 is used to clock latch 312, transitions between DFT clock 314 and clock signal 110 are synchronous with clock signal 110 to avoid any glitches on the clk-out signal output from multiplexer 310. In the example of FIG. 3, integrated clock multiplexer 308 is capable of switching between DFT clock 314 and clock signal 110 synchronously without any glitching.

In the example of FIG. 3, multiplexer 310 may not be implemented as a glitch-free multiplexer. Glitch free multiplexers do not provide deterministic switching times or exact clock counts. Unlike a glitch free multiplexer, the circuit architecture implemented in integrated clock multiplexer 308 achieves glitch free operation while providing deterministic performance.

Referring to integrated clock multiplexer 308, the output from latch 312 is provided to multiplexer 310 as the select signal S. In one or more other example implementations, an OR gate may be inserted between the output of latch 312 and the select signal port of multiplexer 310. An example implementation of such an arrangement is described in greater detail in connection with FIGS. 4 and 7. Thus, based on the value provided to the select port of multiplexer 310, multiplexer 310 passes either DFT clock 314 or clock signal 110 to IC circuitry 106. Switching between signal 110 and DFT clock 314, which is held at 0, provides the clock stretching functionality in the form of a modified version of clock signal 110 output as clk-out.

As discussed, since the enable signal is set to a value of 1 during the time between the start value stored in start bit registers 214 and the end value stored in end bit registers 216, the clock shaper circuit 302 remains active or enabled. Stretch mode CC enable signal 316, for the particular clock controller(s) 104 intended to implement the clock stretch mode, is also active for that portion of time.

Figure 4:
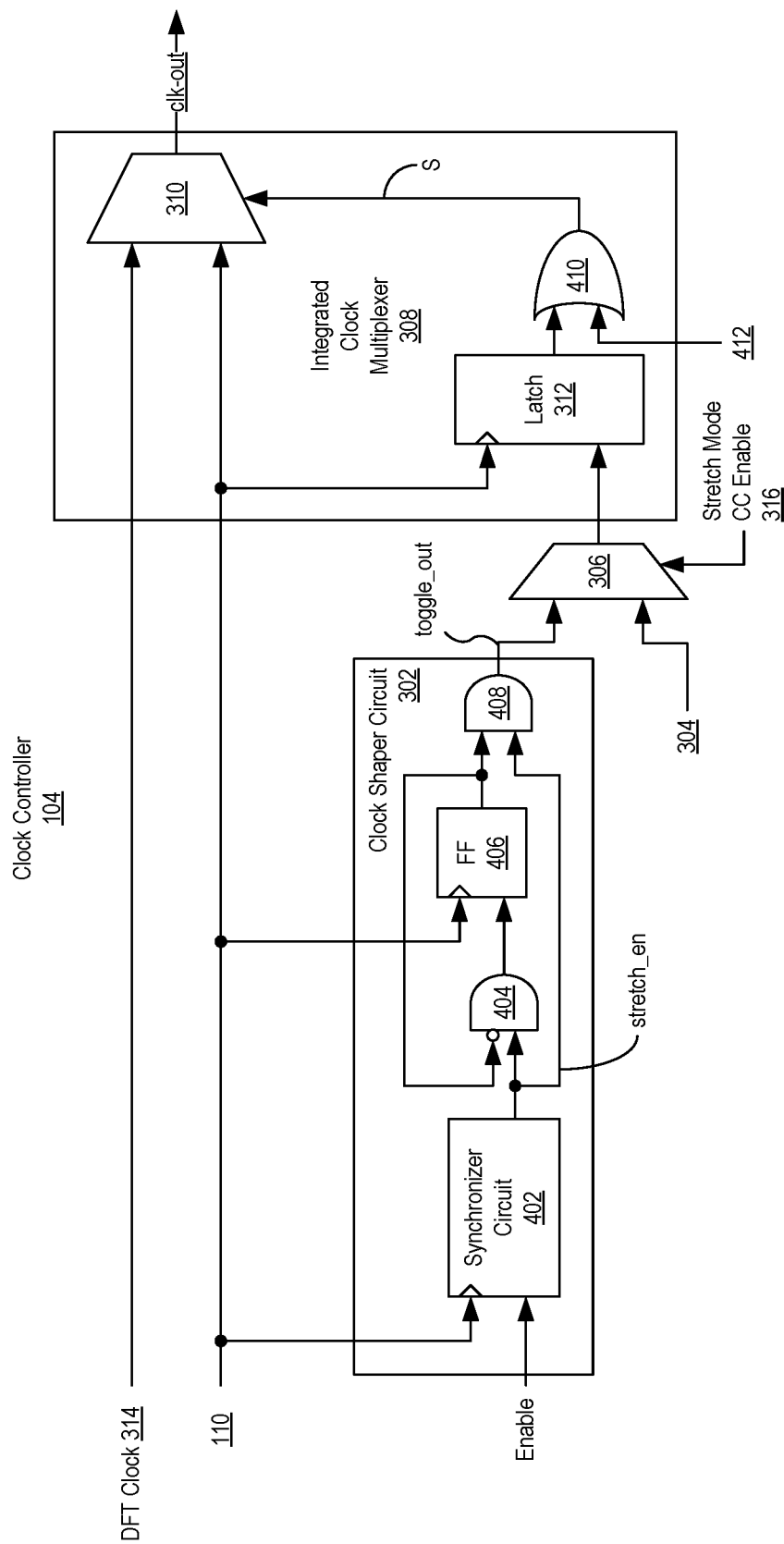
FIG. 4 illustrates an example of a clock shaper circuit of the clock stretching circuitry of FIG. 1.
Figure 5:
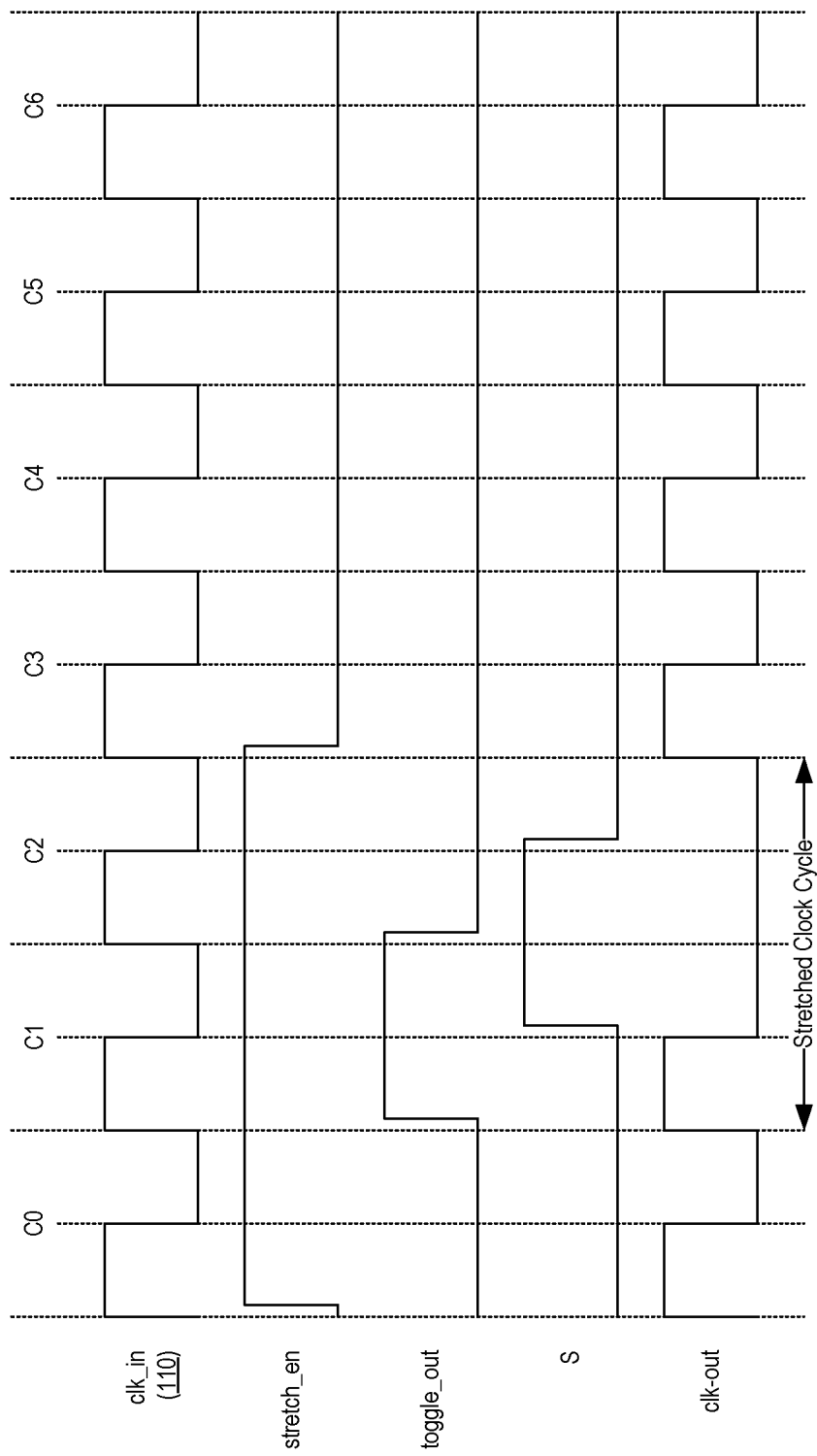
FIG. 5 illustrates example signal waveforms generated using the clock shaper circuitry of FIG. 4.
Figure 6:
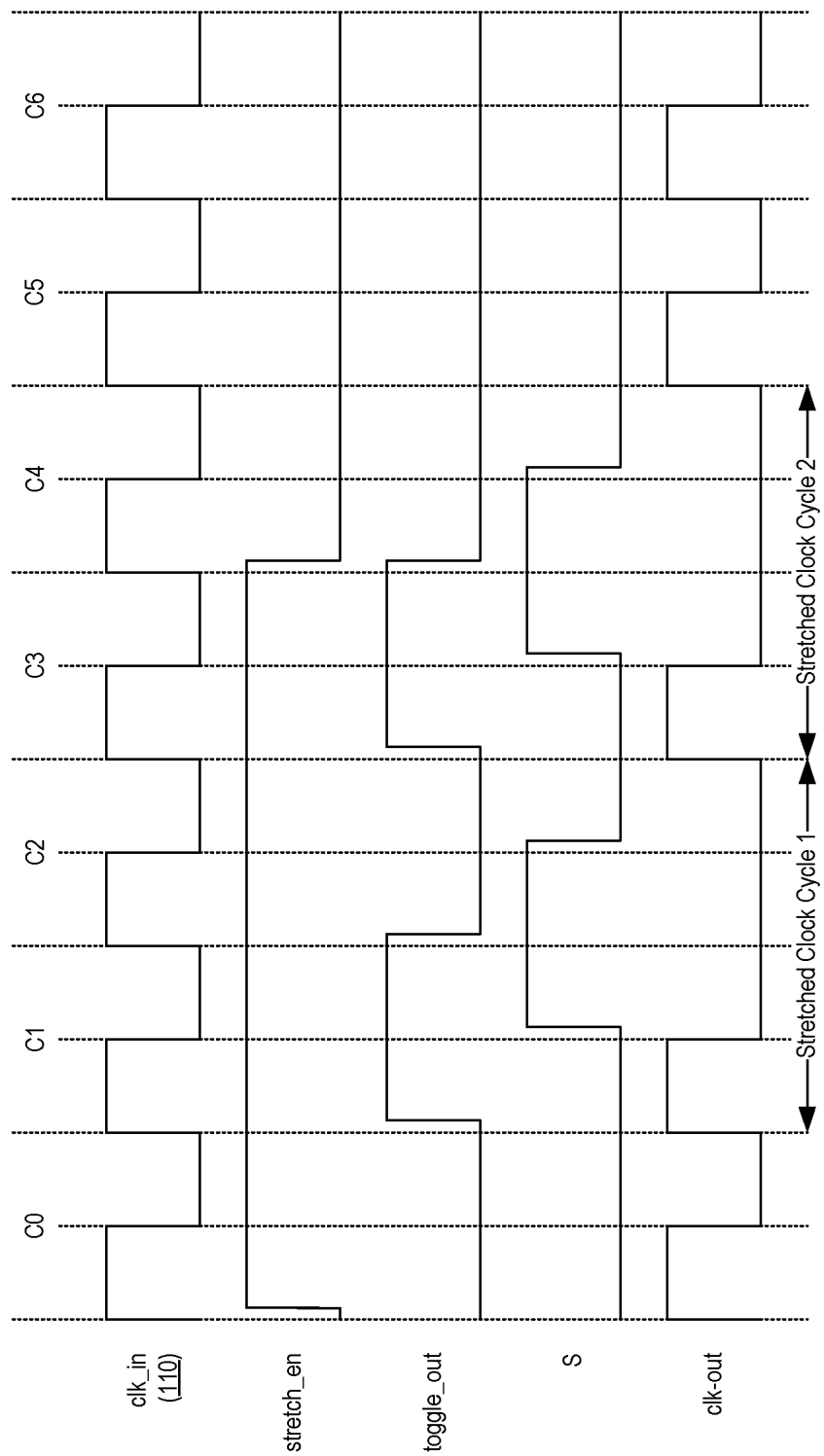
FIG. 6 illustrates example signal waveforms generated using the clock shaper circuitry of FIG. 4.

FIG. 4 illustrates an example of a clock shaper circuit 302 of the clock stretching circuitry of FIG. 1. The example of FIG. 4 shows a more detailed view of clock shaper circuit 302 within clock controller 104. The example implementation shown in FIG. 4 is capable of implementing a clock stretch mode wherein the clk-out signal output from integrated clock multiplexer 308 has a 25% (or approximately 25%) duty cycle as illustrated in the examples of FIGS. 5 and 6.

Clock shaper circuit 302 includes a synchronizer circuit 402, AND gates 404, 408, and a flip-flop (FF) 406. Synchronizer circuit 402 receives the enable signal broadcast from trigger circuit 102 and is clocked by clock signal 110. In response to the enable signal being set to 1, synchronizer circuit 402 starts clock shaper circuit 302 operating and outputs a version of the enable signal synchronized to clock signal 110 as the "stretch_en" signal to the non-inverting input of AND gate 404 and to an input of AND gate 408. AND gate 404 provides an output signal to the input of FF 406, which is clocked by clock signal 110. The output of FF 406 is fed back (e.g., as a feedback path) to the inverting input of AND gate 404 and also provided to an input of AND gate 408. AND gate 408 generates the toggle_out signal from clock shaper circuit 302 that is provided to an input of multiplexer 306.

In the example of FIG. 4, since the enable signal is synchronized to a particular clock domain (e.g., the clock signal 110 passed by multiplexer 210), clock shaper synchronizer 402 is capable of synchronizing the enable signal to a particular clock domain, which may be different from the clock domain selected in FIG. 2. Accordingly, the stretch_en signal may be viewed as a version of the enable signal that is synchronized to the clock domain corresponding to the particular clock controller 104 shown. The enable signal, and as such, the stretch_en, in combination with the stretch mode CC enable signal 316, defines when stretching of the clock signal 110 starts and when stretching of the clock signal 110 ends. Synchronizer circuit 402, which may be implemented as one or more flip-flops, facilitates CDC.

As noted, multiplexer 306 passes the toggle_out signal from clock shaper circuit 302 to latch 312. In the example of FIG. 4, stretch_en signal may be set high for at least 3 clock cycles (e.g., 3 clock cycles of clock signal 110) in order to start obtaining stretched clock pulses as shown in FIGS. 5 and 6. Typically, the stretch_en signal will be set high for more than 3 clock cycles. In the example of FIG. 4, OR gate 410 is inserted between the output of latch 312 and the select port of multiplexer 310. The output of OR gate 410 is the select signal S in the example of FIG. 4.

The example circuitry of FIG. 4 illustrates how a clock cycle may be stretched without adding any additional delay on the path of clock signal 110. Multiplexer 310, when in the clock stretch mode, is capable of switching between DFT clock 314, which is held at 0, and clock signal 110. Every alternate clock pulse of clock signal 110 may be chopped (e.g., suppressed) by controlling the select signal S provided to multiplexer 310 to provide a 25% duty cycle. In the example, signal 412, which may be provided from control logic (not shown), is held constant while the clock stretch mode is active so that select signal S changes with the output from latch 312.

FIG. 5 illustrates example signal waveforms generated using the example circuitry of FIG. 4. In the example, when the enable signal provided to synchronizer circuit 402 goes to 1, the output from synchronizer circuit 402 begins toggling FF 406. The output of FF 406 alternates every clock cycle. The output from FF 406, as run through AND gate 408, is used as the select line S to multiplexer 310 to suppress clock signal 110 every alternate clock cycle to obtain a divide by two operation on clk-out where clk-out has a 25% duty cycle.

When the stretch_en signal goes high in cycle C0, the toggle_out signal starts toggling in the next clock cycle (C1). When the stretch_en signal is set to 1, clock chopping to implement the clock stretch mode takes effect in the next clock cycle. The select signal S is a phased version of the toggle_out signal. Accordingly, whatever the toggle_out signal looks like, the select signal S is a shifted version of the toggle_out signal. The clk-out responds to the select signal S. In response to the select signal S going high, multiplexer 310 passes DFT clock 314, which is held at 0, thereby suppressing the clock pulse on clock signal 110. The net effect is that clock signal 110 (as modified and embodied in clk-out) is stretched for a period of time so that one stretched clock cycle lasts for 2 normal clock cycles of clock signal 110.

FIG. 6 illustrates example waveforms generated using the example of circuitry of FIG. 4. In the example of FIG. 6, clock signal 110 (as modified and embodied in clk-out) is stretched for 4 clock cycles.

It should be appreciated that the clock stretching may continue for more than the number of clock cycles shown in the examples of FIGS. 5 and 6. Clock stretching may be performed based on the start value and end value stored in start bit registers 214 and end bit registers 216 of FIG. 2.

Figure 7:
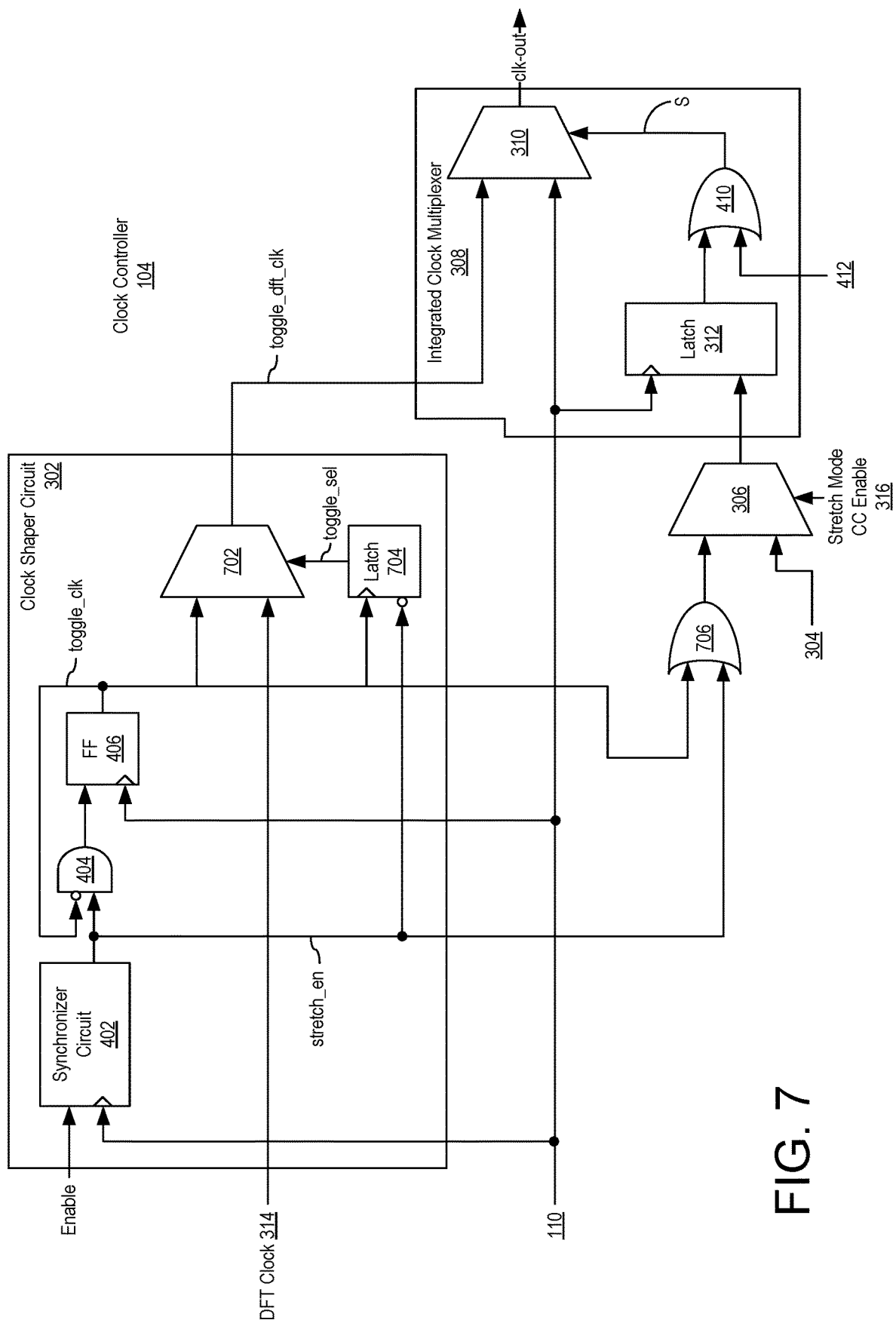
FIG. 7 illustrates another example of a clock shaper circuit of the clock stretching circuitry of FIG. 1.
Figure 8:
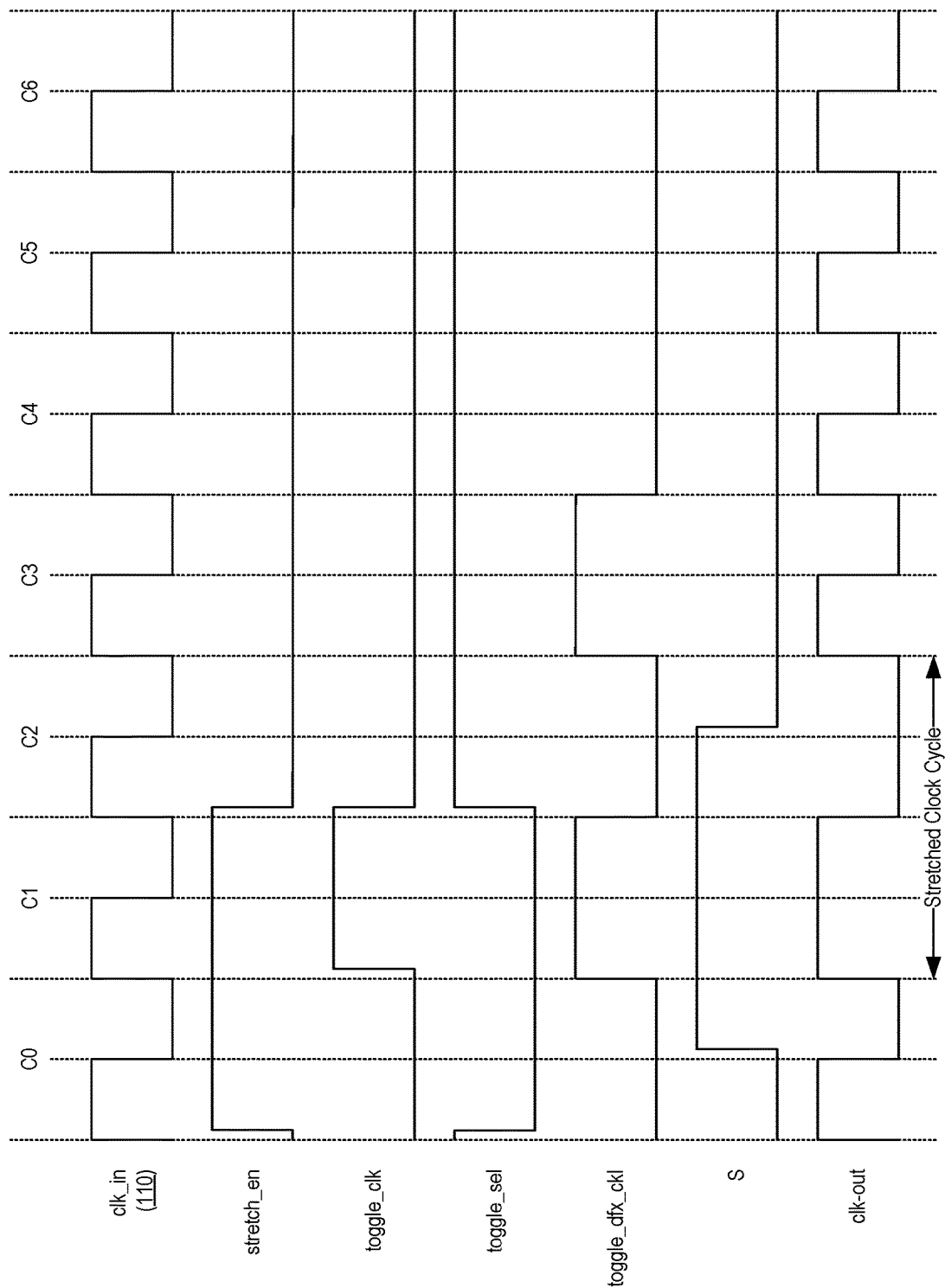
FIG. 8 illustrates example signal waveforms generated using the clock shaper circuitry of FIG. 7.
Figure 9:
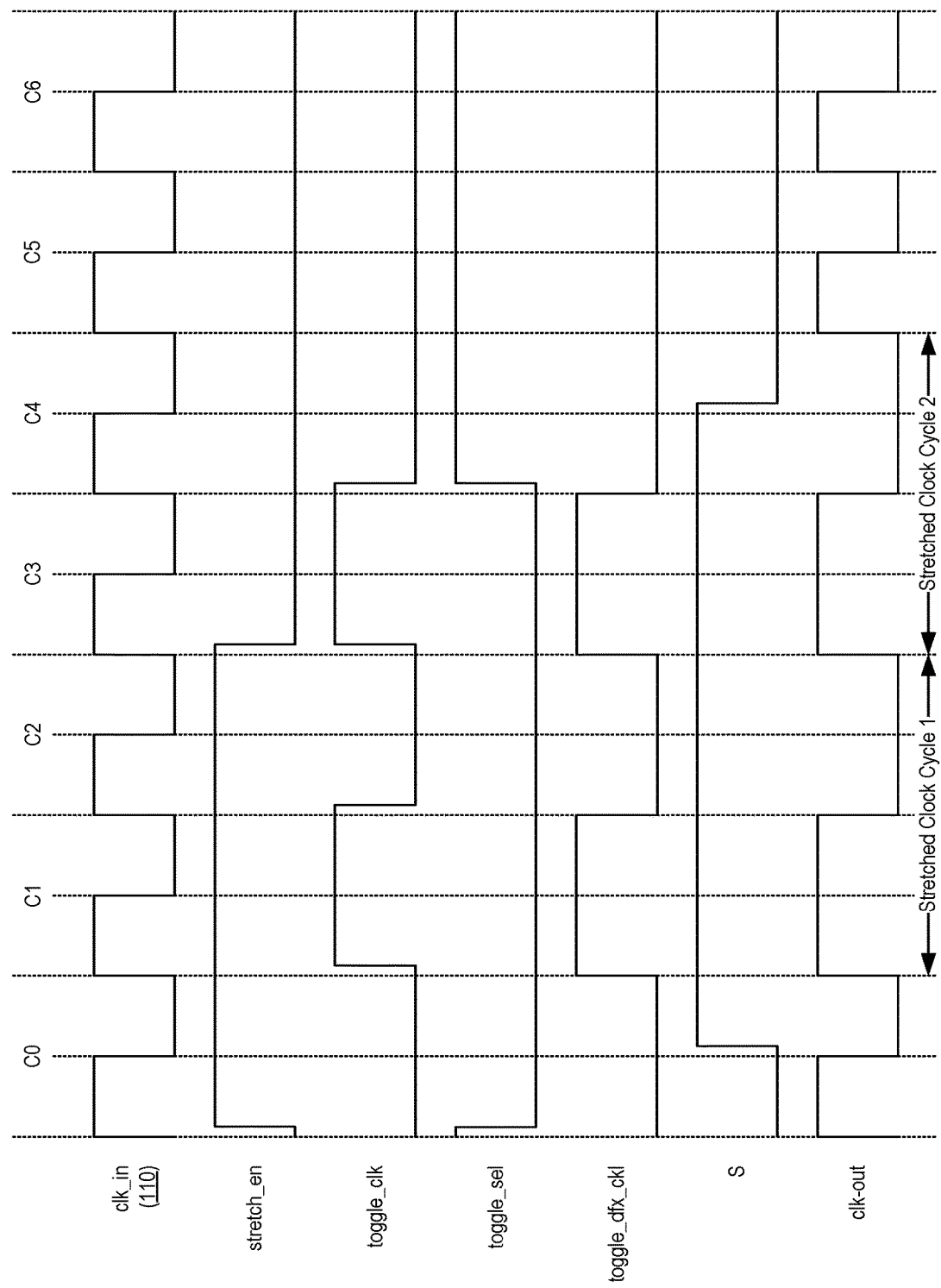
FIG. 9 illustrates example signal waveforms generated using the clock shaper circuitry of FIG. 7.

FIG. 7 illustrates another example of clock shaper circuit 302 of the clock stretching circuitry of FIG. 1. The example of FIG. 7 shows a more detailed view of clock shaper circuit 302 within clock controller 104, where clock shaper circuit 302 is configured to implement a clock stretch mode where the clk-out signal output from multiplexer 310 has a 50% (or approximately 50%) duty cycle as illustrated in the examples of FIGS. 8 and 9.

Clock shaper circuit 302 includes synchronizer circuit 402, AND gate 404, FF 406, multiplexer 702, and latch 704. Synchronizer circuit 402 receives the enable signal broadcast from trigger circuit 102 and is clocked by clock signal 110. In response to the enable signal being set to 1, synchronizer circuit 402 starts clock shaper circuit 302 operating and outputs the enable signal as the stretch_en signal to the non-inverting input of AND gate 404, to an inverting input of latch 704, and to an input of OR gate 702. AND gate 404 provides an output signal to the input of FF 406, which is clocked by clock signal 110. The output of FF 406, which is the "toggle_clk" signal in this example, is fed back (e.g., as a feedback path) to the inverting input of AND gate 404, is provided to an input of multiplexer 702, and is provided to an input of OR gate 706. DFT clock 314 is provided to another input of multiplexer 702 and may be held at 0 (e.g., constant).

The output of latch 704, which is clocked by the toggle_clk signal, is provided to the select port of multiplexer 702 as a select signal referred to as "toggle_sel." The output from multiplexer 702, which is determined by the toggle_sel signal and called "toggle_dft_clk," is provided to an input of multiplexer 310. Clock signal 110 is provided to another input of multiplexer 310.

Multiplexer 306 passes the output from OR gate 706 to an input of latch 312. In the example of FIG. 7, the stretch_en signal may be set high for at least 2 clock cycles (e.g., 2 clock cycles of clock signal 110) in order to start obtaining stretched clock pulses as shown in FIGS. 8 and 9. In the example of FIG. 7, OR gate 410 is inserted between the output of latch 312 and the select port of multiplexer 310. The output of OR gate 410 is the select signal S in the example of FIG. 7. Signal 412 may be set to a constant value so that select signal S changes with the output of latch 312.

The example circuitry of FIG. 7 illustrates how a clock cycle may be stretched without adding any additional delay on the path of clock signal 110. Multiplexer 310, when in the clock stretch mode, passes toggle_dft_clk signal as the clk-out signal (e.g., the modified clock signal) as opposed to clock signal 110. In the example of FIG. 7, the select signal S provided to multiplexer 310 selects the toggle_dft_clk signal as the clk-out signal that is passed. The select signal S is held constant while in clock stretch mode to pass the toggle_dft_clk as the clk-out signal. As generated by clock shaper circuit 302, the toggle_dft_clk signal is a version of clock signal 110 that is half the frequency (is a divide by 2 version) and that also has a 50% duty cycle. In the example, signal 412, which may be provided from control logic or another source, is held constant while the clock stretch mode is active.

In the example of FIG. 7, no additional delay is added to clock signal 110 other than multiplexer 310. Additional delay is added on the clock network when the example of FIG. 7 operates in a debug mode, e.g., in cases where DFT clock 314 is output as clk-out.

FIG. 8 illustrates example signal waveforms generated using the example of FIG. 7. In the example, when the enable signal provided to synchronizer circuit 402 goes to 1, the output from synchronizer circuit 402 begins toggling FF 406. In response to the stretch_en signal going high, clock chopping takes effect in the next clock cycle. That is, the toggle_clk signal goes high in the clock cycle following the stretch_en signal going high. The toggle_sel signal is a slightly phase adjusted (e.g., slightly delayed) and inverted version of the stretch_en signal. In the example, the toggle_clk signal is used to control the select signal S to multiplexer 310. The toggle_dft_clock, based on the state of the toggle_sel signal provided as a select signal to multiplexer 702, is either the toggle_clk signal or the DFT clock 314. In response to the toggle_sel signal going high, the DFT clock 314 is passed by multiplexer 702. In response to the toggle_sel signal going low, the toggle_clk signal is passed by multiplexer 702. The select signal S picks either the toggle_dfx_clk signal or clock signal 110. The select signal S is a function of the stretch_en signal and the toggle_clk signal. In response to the select signal S going high, multiplexer 310 passes the toggle_dfx_clk signal as clk-out. In response to the select signal S going low, multiplexer 310 passes the clock signal 110 as clk-out. The result is that when select signal S is high, clk-out, being toggle_dfx_clk, has a balanced duty cycle of 50% and a frequency that is one-half of the frequency of clock signal 110. Thus, during the stretch mode, it appears that clock signal 110 has been stretched for a period of time so that one stretched clock cycle lasts for 2 clock cycles of clock signal 110.

FIG. 9 illustrates example waveforms generated using the example of FIG. 7. In the example of FIG. 9, clock signal 110 (as modified and embodied in clk-out) is stretched for 4 clock cycles.

It should be appreciated that the clock stretching may continue for more than the number of clock cycles shown in the examples of FIGS. 8 and 9. Clock stretching may be performed for the window of time enumerated by the values stored in start bit registers 214 and end bit registers 216 of FIG. 2. In the examples of FIGS. 8 and 9, when exiting the stretch mode, both the stretch_en signal and the toggle_clk signal go low before clk-out reverts to clock signal 110.

In the example implementations described within this disclosure, to obtain full cycle accurate determinism, at speed timing should be closed for the following signal paths: from the output of OR gate 206 to the input of synchronizer circuit 208; between comparator circuit 218 and counter circuit 212; between comparator circuit, 220 and counter circuit 212; between synchronizer circuit 208 and counter circuit 212 for all clocks signals 110-1 through 110-N; between comparator circuits 218 and AND gate 222; between comparator circuits 220 and AND gate 222; from AND gate 222 to synchronization circuit 402; from synchronizer circuit 402 to AND gate 404; from synchronizer circuit 402 to AND gate 408; from AND gate 408 to latch 312; and from latch 312 to the select line port of multiplexer 310.

In an example implementation, the clock stretch circuitry may be implemented to include one or more clock controllers as described in connection with FIG. 4. In another example implementation, the clock stretch circuitry may be implemented to include one or more clock controllers as described in connection with FIG. 7. In still another example implementation, the clock stretch circuitry may be implemented to include one or more clock controllers as described in connection with FIG. 7 and one or more clock controllers as described in connection with FIG. 8. For example, a 25% duty cycle may be used with circuits that utilize FFs whereas a 50% duty cycle may be preferable with latch-based circuits. Many CPUs, for example, use latches. Accordingly, depending on the mix and characteristics of circuits included in a given design, the number and/or type of clock control circuits may vary.

The example implementations described herein may be used to test and/or debug speed-paths of an IC. The inventive arrangements allow testing and/or debugging to be conducted in significantly less time than is the case using other conventional techniques. As an example, consider a case where an at speed error is known to occur within a 10,000 clock cycle window of time. Using the clock stretch circuitry described herein, the clock stretch mode may be enabled for the first 5,000 clock cycles and deactivated for the second 5,000 clock cycles. If the error does not occur during the 10,000 clock cycle time period, the error is determined to occur within the first 5,000 clock cycles. Further testing may be performed in accordance with a binary search to narrow down the time period to a particular cycle. Using the inventive arrangements described herein, the clock stretch mode may be dynamically implemented as needed without the need to reboot and/or reset the IC between iterations of the binary search as is the case with other debug techniques. One need only reinitialize the clock stretch circuitry (e.g., start registers, stop registers, counter circuitry, and/or trigger enable interface), for example, based on the updated binary search since the clocks are only slowed and no destructive scan dump is performed. Initialization of the clock stretch circuitry requires much less time than rebooting and/or resetting the entire IC (e.g., IC circuitry 106 and/or other circuitry of IC 100), thereby significantly reducing the amount of time needed to isolate the fault to a particular clock cycle to locate the cause.

Figure 10:
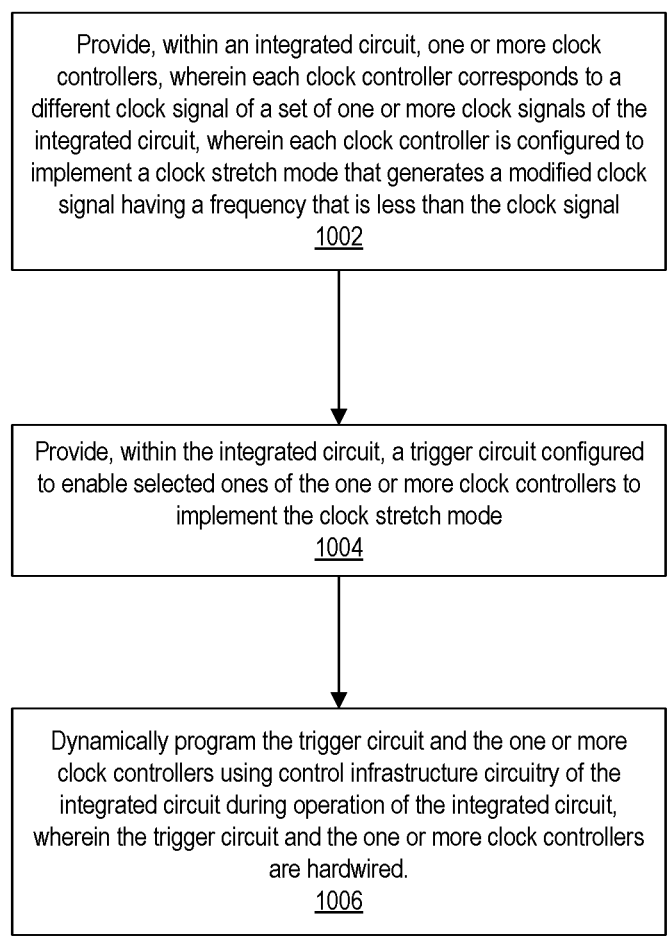
FIG. 10 illustrates an example method of implementing clock stretching circuitry and a clock stretching mode.

FIG. 10 illustrates an example method 1000 of implementing clock stretching circuitry and a clock stretching mode. In block 1002, one or more clock controllers 104 may be provided within an IC 100. Each clock controller 104 corresponds to a different clock signal of a set of one or more clock signals 110 of the IC 100. Each clock controller 104 is configured to implement a clock stretch mode that generates a modified clock signal having a frequency that is less than the clock signal 110.

In block 1004, a trigger circuit 102 is provided within the IC 100. The trigger circuit 102 is configured to enable selected ones of the one or more clock controllers 104 to implement the clock stretch mode. In block 1006, the trigger circuit 102 and the one or more clock controllers 104 may be dynamically programmed using control infrastructure circuitry of the IC 100 during operation of the IC 100. For example, the trigger circuit 102 and the one or more clock controllers 104 may be programmed and/or reprogrammed in real time. The trigger circuit 102 and the one or more clock controllers 104 are hardwired.

The foregoing and other implementations can each optionally include one or more of the following features, alone or in combination. Some example implementations include all the following features in combination.

In another aspect, dynamically programming can include configuring the trigger circuit to enable particular ones of the one or more clock controllers 104 on an independent basis based on selected ones of a plurality of trigger signals 108.

For example, the trigger circuit 102 may be programmed to enable and/or disable particular trigger signals via trigger enable interface 202. The selected ones of the plurality of trigger signals 108 are programmable using the control infrastructure circuitry.

In another aspect, dynamically programming can include configuring the trigger circuit 102 to enable particular ones of the one or more clock controllers 104 for a predefined window of time. The predefined window of time is programmable through the control infrastructure circuitry. For example, the trigger circuit 102 may be programmed to set a start value in start bit registers 214 and/or to set an end value in end bit registers 216. The start value and the end value may be programmed using the control infrastructure circuitry.

In another aspect, the method can include determining the predefined window of time based on a reference clock signal (e.g., debug_clk) selected from a plurality of clock signals 110 of the IC 100. The reference clock signal may be selected via programming using the control infrastructure circuitry. For example, control infrastructure signals may be provided as select signals to multiplexer 210.

In another aspect, the method can include programming the trigger circuit 102 using the control infrastructure circuitry to select different ones of the plurality of clock signals 110 as the reference clock signal. That is, the trigger circuit 102 may be dynamically programmed to use different ones of the clock signals 110 at different times during operation of IC 100 based on the programming. Thus, different clock signals may be selected via programming as described in real time or near real time as may other features be programmed and changed in real time or near real time.

In another aspect, each clock controller implements the clock stretch mode wherein the modified clock signal has a 25% duty cycle. In another aspect, each clock controller implements the clock stretch mode wherein the modified clock signal has a 50% duty cycle.

In another aspect, the method can include implementing the clock stretch mode to generate the modified clock signal by selectively switching between the clock signal 110 and an alternate clock signal (e.g., DFT clock 314 or toggle_dft_clk) using multiplexer 310 based on a select signal S provided to the multiplexer 310, wherein the select signal S is synchronized with the clock signal 110 and the clock signal 110 is free running.

While the disclosure concludes with claims defining novel features, it is believed that the various features described within this disclosure will be better understood from a consideration of the description in conjunction with the drawings. The process(es), machine(s), manufacture(s) and any variations thereof described herein are provided for purposes of illustration. Specific structural and functional details described within this disclosure are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features described.

For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

As defined herein, the singular forms "a," "an," and "the" are intended to include the plural forms as well, unless the context clearly indicates otherwise.

As defined herein, the term "approximately" means nearly correct or exact, close in value or amount but not precise. For example, the term "approximately" may mean that the recited characteristic, parameter, or value is within a predetermined amount of the exact characteristic, parameter, or value.

As defined herein, the terms "at least one," "one or more," and "and/or," are open-ended expressions that are both conjunctive and disjunctive in operation unless explicitly stated otherwise. For example, each of the expressions "at least one of A, B, and C," "at least one of A, B, or C," "one or more of A, B, and C," "one or more of A, B, or C," and "A, B, and/or C" means A alone, B alone, C alone, A and B together, A and C together, B and C together, or A, B and C together.

As defined herein, the term "automatically" means without human intervention. As defined herein, the term "user" means a human being.

As defined herein, the term "if" means "when" or "upon" or "in response to" or "responsive to," depending upon the context. Thus, the phrase "if it is determined" or "if [a stated condition or event] is detected" may be construed to mean "upon determining" or "in response to determining" or "upon detecting [the stated condition or event]" or "in response to detecting [the stated condition or event]" or "responsive to detecting [the stated condition or event]" depending on the context.

As defined herein, the term "responsive to" and similar language as described above, e.g., "if," "when," or "upon," means responding or reacting readily to an action or event. The response or reaction is performed automatically. Thus, if a second action is performed "responsive to" a first action, there is a causal relationship between an occurrence of the first action and an occurrence of the second action. The term "responsive to" indicates the causal relationship.

As defined herein, the term "output" means storing in physical memory elements, e.g., devices, writing to display or other peripheral output device, sending or transmitting to another system, exporting, or the like.

As defined herein, the term "real time" means a level of processing responsiveness that a user or system senses as sufficiently immediate for a particular process or determination to be made, or that enables the processor to keep up with some external process.

As defined herein, the term "substantially" means that the recited characteristic, parameter, or value need not be achieved exactly, but that deviations or variations, including for example, tolerances, measurement error, measurement accuracy limitations, and other factors known to those of skill in the art, may occur in amounts that do not preclude the effect the characteristic was intended to provide.

The terms first, second, etc. may be used herein to describe various elements. These elements should not be limited by these terms, as these terms are only used to distinguish one element from another unless stated otherwise or the context clearly indicates otherwise.

In some alternative implementations, the operations noted in the blocks may occur out of the order noted in the figures. For example, two blocks shown in succession may be executed substantially concurrently, or the blocks may sometimes be executed in the reverse order, depending upon the functionality involved. In other examples, blocks may be performed generally in increasing numeric order while in still other examples, one or more blocks may be performed in varying order with the results being stored and utilized in subsequent or other blocks that do not immediately follow. It will also be noted that each block of the block diagrams and/or flowchart illustration, and combinations of blocks in the block diagrams and/or flowchart illustration, may be implemented by special purpose hardware-based systems that perform the specified functions or acts or carry out combinations of special purpose hardware and computer instructions.

What is claimed is:

1. An integrated circuit, comprising:
one or more clock controllers, wherein each clock controller corresponds to a different clock signal of a set of one or more clock signals of the integrated circuit, wherein each clock controller is configured to implement a clock stretch mode that generates a modified clock signal having a frequency that is less than the clock signal;
a trigger circuit configured to enable selected ones of the one or more clock controllers to implement the clock stretch mode; and
wherein the trigger circuit and the one or more clock controllers are hardwired and are programmable using control infrastructure circuitry of the integrated circuit.

2. The integrated circuit of claim 1, wherein the trigger circuit is programmable to enable particular ones of the one or more clock controllers on an independent basis based on selected ones of a plurality of trigger signals.

3. The integrated circuit of claim 2, wherein the selected ones of the plurality of trigger signals are programmable using the control infrastructure circuitry.

4. The integrated circuit of claim 1, wherein the trigger circuit is programmable to enable particular ones of the one or more clock controllers for a predefined window of time.

5. The integrated circuit of claim 4, wherein the predefined window of time is programmable through the control infrastructure circuitry.

6. The integrated circuit of claim 4, wherein the trigger circuit receives a plurality of clock signals of the integrated circuit and the predefined window of time is determined based on a reference clock signal selected from the plurality of clock signals of the integrated circuit.

7. The integrated circuit of claim 6, wherein the trigger circuit is programmable using the control infrastructure circuitry to select different ones of the plurality of clock signals as the reference clock signal.

8. The integrated circuit of claim 1, wherein each clock controller implements the clock stretch mode wherein the modified clock signal has a 25% duty cycle.

9. The integrated circuit of claim 1, wherein each clock controller implements the clock stretch mode wherein the modified clock signal has a 50% duty cycle.

10. The integrated circuit of claim 1, wherein the modified clock signal of the clock stretch mode is generated by selectively switching between the clock signal and an alternate clock signal using a multiplexer based on a select signal provided to the multiplexer, wherein the select signal is synchronized with the clock signal and the clock signal is free running.

11. A method, comprising:
providing, within an integrated circuit, one or more clock controllers, wherein each clock controller corresponds to a different clock signal of a set of one or more clock signals of the integrated circuit, wherein each clock controller is configured to implement a clock stretch mode that generates a modified clock signal having a frequency that is less than the clock signal;
providing, within the integrated circuit, a trigger circuit configured to enable selected ones of the one or more clock controllers to implement the clock stretch mode; and
dynamically programming the trigger circuit and the one or more clock controllers using control infrastructure circuitry of the integrated circuit during operation of the integrated circuit, wherein the trigger circuit and the one or more clock controllers are hardwired.

12. The method of claim 11, wherein the dynamically programming comprises:
configuring the trigger circuit to enable particular ones of the one or more clock controllers on an independent basis based on selected ones of a plurality of trigger signals.

13. The method of claim 12, wherein the selected ones of the plurality of trigger signals are programmable using the control infrastructure circuitry.

14. The method of claim 11, wherein the dynamically programming comprises:
configuring the trigger circuit to enable particular ones of the one or more clock controllers for a predefined window of time.

15. The method of claim 14, wherein the predefined window of time is programmable through the control infrastructure circuitry.

16. The method of claim 14, further comprising:
determining the predefined window of time based on a reference clock signal selected from a plurality of clock signals of the integrated circuit.

17. The method of claim 16, further comprising:
programming the trigger circuit using the control infrastructure circuitry to select different ones of the plurality of clock signals as the reference clock signal.

18. The method of claim 11, wherein each clock controller implements the clock stretch mode wherein the modified clock signal has a 25% duty cycle.

19. The method of claim 11, wherein each clock controller implements the clock stretch mode wherein the modified clock signal has a 50% duty cycle.

20. The method of claim 11, further comprising:
implementing the clock stretch mode to generate the modified clock signal by selectively switching between the clock signal and an alternate clock signal using a multiplexer based on a select signal provided to the multiplexer, wherein the select signal is synchronized with the clock signal and the clock signal is free running.

* * * * *